(12) United States Patent
Takeda et al.

(10) Patent No.: US 6,835,804 B2
(45) Date of Patent: Dec. 28, 2004

(54) PREPARATION OF POLYMER, AND RESIST COMPOSITION USING THE POLYMER

(75) Inventors: Takanobu Takeda, Nakakubiki-gun (JP); Osamu Watanabe, Nakakubiki-gun (JP)

(73) Assignee: Shin-Etsu Chemical Co., LTD., Tokyo (JP)

( * ) Notice: Subject to any disclaimer, the term of this patent is extended or adjusted under 35 U.S.C. 154(b) by 209 days.

(21) Appl. No.: 10/003,121

(22) Filed: Dec. 6, 2001

(65) Prior Publication Data
US 2002/0111459 A1 Aug. 15, 2002

(30) Foreign Application Priority Data
Dec. 7, 2000 (JP) ........................................ 2000-372408

(51) Int. Cl.[7] .............................. C08F 6/06; G03F 7/039
(52) U.S. Cl. ........................ 528/486; 528/176; 528/192; 525/326.1; 525/330.3; 525/333.3; 525/192; 526/313; 526/328; 526/329.2; 526/346; 526/329.4; 526/329.6; 430/270.1
(58) Field of Search ................................. 526/313, 328, 526/329.2, 346, 329.4, 329.6; 430/270.1, 325, 326, 905–909; 528/486, 176, 192; 525/326.1, 330.3, 333.3, 192

(56) References Cited

U.S. PATENT DOCUMENTS

| | | | |
|---|---|---|---|
| 4,491,628 A | | 1/1985 | Ito et al. |
| 5,310,619 A | | 5/1994 | Crivello et al. |
| 5,412,050 A | * | 5/1995 | Watanabe et al. ............ 526/313 |
| 5,843,624 A | * | 12/1998 | Houlihan et al. ............ 430/296 |
| 6,143,460 A | * | 11/2000 | Kobayashi et al. ......... 430/170 |
| 6,280,900 B1 | * | 8/2001 | Chiba et al. .............. 430/270.1 |
| 6,281,318 B1 | * | 8/2001 | Yamamoto et al. ......... 526/313 |
| 6,656,660 B1 | * | 12/2003 | Urano et al. .............. 430/270.1 |

FOREIGN PATENT DOCUMENTS

| | | |
|---|---|---|
| JP | 61291606 A | 12/1986 |
| JP | 63027829 A | 2/1988 |
| JP | 90027660 B | 6/1990 |
| JP | 3275149 A | 12/1991 |
| JP | 6289608 A | 3/1993 |

* cited by examiner

Primary Examiner—Cynthia H. Kelly
Assistant Examiner—Sin J. Lee

(74) Attorney, Agent, or Firm—Millen White Zelano & Branigan, P.C.

(57) ABSTRACT

A polymer comprising recurring units of formula (2) is prepared by effecting deblocking reaction on a polymer comprising recurring units of formula (1) in the presence of an acid catalyst.

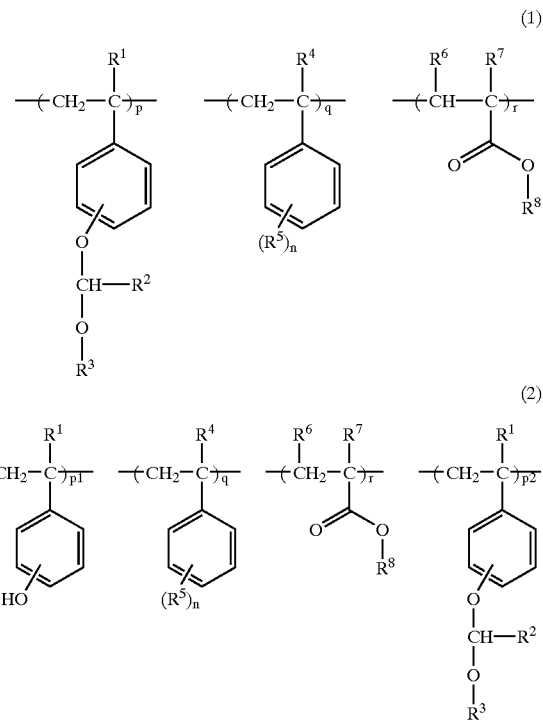

In the formulae, $R^1$ and $R^4$ are H or methyl, $R^2$ and $R^3$ are C1–C10 alkyl, or $R^2$ and $R^3$ may form a ring, $R^5$ is H, hydroxyl, alkyl, alkoxy or halogen, $R^6$ and $R^7$ are H, methyl, alkoxycarbonyl, cyano or halogen, $R^8$ is C4–C20 tertiary alkyl, n is an integer of 0 to 4, p is a positive number, q and r each are 0 or a positive number, exclusive of q=r=0, p1 is a positive number, p2 is 0 or a positive number, and p1+p2=p. The polymer thus produced has a narrower molecular weight distribution than polymers produced by the prior art methods. A resist composition comprising the polymer as a base resin has advantages including a dissolution contrast of resist film, high resolution, exposure latitude, process flexibility, good pattern profile after exposure, and minimized line edge roughness.

14 Claims, No Drawings

PREPARATION OF POLYMER, AND RESIST COMPOSITION USING THE POLYMER

This invention relates to a method for preparing a polymer and a resist composition, typically chemically amplified positive resist composition comprising the polymer, which composition exhibits a remarkably increased contrast of alkali dissolution rate before and after exposure, a high sensitivity, high resolution, good definition of pattern profile, and minimized edge roughness and lends itself to the microfabrication of VLSI'S.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.5 μm or less and, when a resist having low light absorption is used, can form patterns with sidewalls that are nearly perpendicular to the substrate.

Recently developed acid-catalyzed chemical amplification positive resists, such as those described in JP-B 2-27660, JP-A 63-27829, U.S. Pat. Nos. 4,491,628 and 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution inhibitor having acid labile groups.

For example, JP-A 6-289608 disclose resist materials using a copolymer of hydroxystyrene and (meth)acrylic tertiary ester. The resist materials of this type suffer from poor heat resistance and an indefinite pattern profile after exposure and are not satisfactory in resolution as well. This is partly because only two approaches are available for the synthesis of copolymers of hydroxystyrene and (meth) acrylic tertiary ester. One approach involves polymerizing an acetoxystyrene monomer with a (meth)acrylic tertiary ester monomer and deblocking acetoxy sites on the resulting polymer. The other approach is direct polymerization of a hydroxystyrene monomer with a (meth)acrylic tertiary ester monomer (see JP-A 61-291606). In these approaches, only radical and cationic polymerizations are possible and the resultant polymers have a very broad molecular weight distribution.

Under the current progress toward higher resolution, it would be desirable to have a resist material exhibiting good definition of pattern profile after exposure and minimized edge roughness.

SUMMARY OF THE INVENTION

An object of the invention is to provide a positive resist composition, especially chemically amplified positive resist composition, which is superior to prior art positive resist compositions in sensitivity, resolution, exposure latitude and process flexibility, and has a satisfactory pattern profile after exposure and minimized edge roughness. Another object is to provide a method for preparing a polymer which is useful as a base resin in the resist composition.

It has been found that a polymer comprising recurring units including hydroxystyrene and (meth)acrylic tertiary ester of the general formula (2) shown below, which is obtained by polymerizing an acetal group-blocked hydroxystyrene monomer with a (meth)acrylic tertiary ester monomer to form a polymer comprising recurring units of the general formula (1) shown below, and effecting selective deblocking reaction on the polymer in the presence of an acid catalyst, and especially a polymer comprising recurring units of the general formula (2) which is obtained by effecting deblocking reaction on a polymer comprising recurring units of the general formula (1) obtained by an anionic polymerization process, in the presence of an acid catalyst, is an effective base resin in a resist composition. The resist composition comprising the polymer has many advantages including an increased dissolution contrast of a resist film, high resolution, exposure latitude, process flexibility, a good pattern profile after exposure, and minimized edge roughness. The composition is thus suited for practical use and advantageously used in microfabrication, especially in VLSI manufacture.

In one aspect, the invention provides a method for preparing a polymer comprising recurring units of the following general formula (2), the method comprising the step of effecting deblocking reaction on a polymer comprising recurring units of the following general formula (1) in the presence of an acid catalyst.

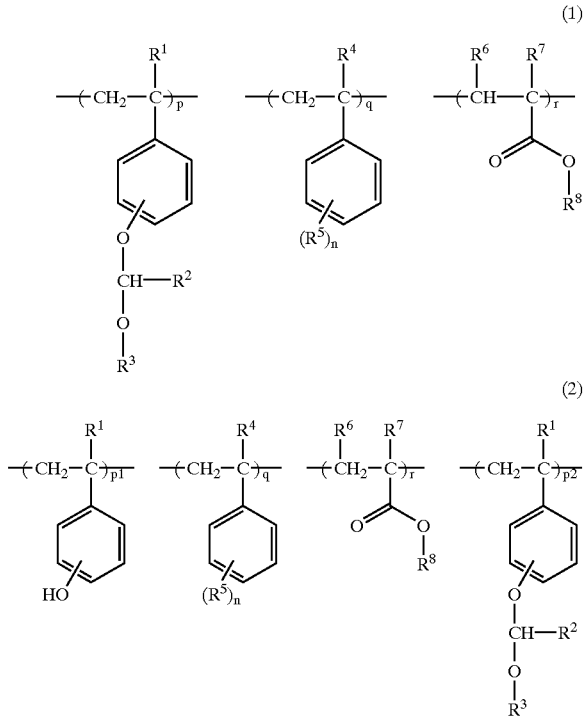

Herein, $R^1$ and $R^4$ each are hydrogen or methyl; $R^2$ and $R^3$ each are a straight or branched alkyl group of 1 to 10 carbon atoms, or $R^2$ and $R^3$, taken together, may form a ring; $R^5$ is hydrogen, a hydroxyl group, straight or branched alkyl group having 1 to 10 carbon atoms, substitutable alkoxy group having 1 to 10 carbon atoms, halogen atom or acid labile group; $R^6$ and $R^7$ each are hydrogen, a methyl group, alkoxycarbonyl group having 2 to 10 carbon atoms, cyano group or halogen atom; $R^8$ is a tertiary alkyl group of 4 to 20 carbon atoms; n is 0 or a positive integer of 1 to 4, p is a positive number, q and r each are 0 or a positive number, q and r are not equal to 0 at the same time; p1 is a positive number, p2 is 0 or a positive number, and p1+p2=p.

Preferably, the polymer comprising recurring units of formula (1) has been produced by an anionic polymerization process.

In another aspect, the invention provides a method for preparing a polymer comprising recurring units of the following general formula (2'), the method comprising the step of introducing acid labile groups into phenolic hydroxyl groups on the polymer comprising recurring units of formula (2) prepared by the method of the first aspect.

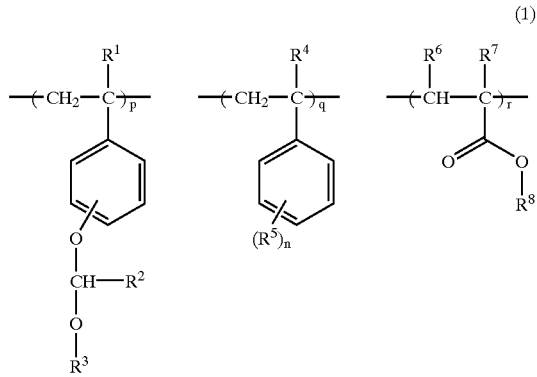

(1)

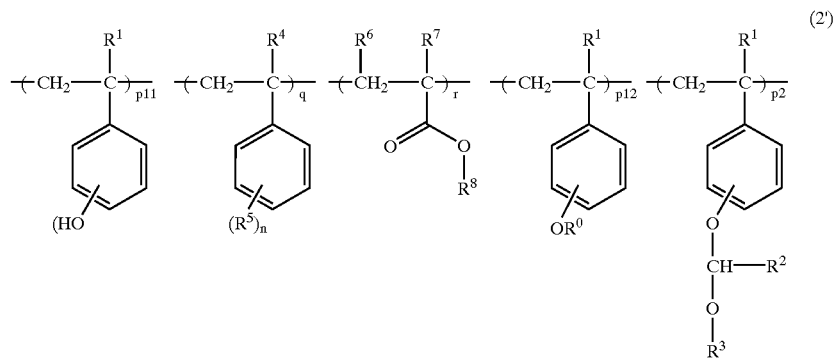

(2')

Herein $R^0$ is an acid labile group, p11 is 0 or a positive number, p12 is a positive number, p11+p12=p1, $R^1$ to $R^8$, n, p1, p2, q and r are as defined above.

In a further aspect, the invention provides a resist composition comprising the polymer comprising recurring units of the general formula (2) obtained by the method of the first aspect.

One preferred embodiment is a chemically amplified positive resist composition comprising (A) an organic solvent, (B) the polymer comprising recurring units of the general formula (2) or (2') obtained by the above method as a base resin, and (C) a photoacid generator. The resist composition may further include (D) a dissolution inhibitor and/or (E) a basic compound.

DESCRIPTION OF THE PREFERRED EMBODIMENT

Method

The method for preparing a polymer according to the invention is to produce a polymer or high molecular weight compound comprising recurring units of the following general formula (2) from a polymer or high molecular weight compound comprising recurring units of the following general formula (1). For the sake of brevity, these polymers are simply referred to as polymer of formula (1) or (2) and more simply as polymer (1) or (2).

-continued

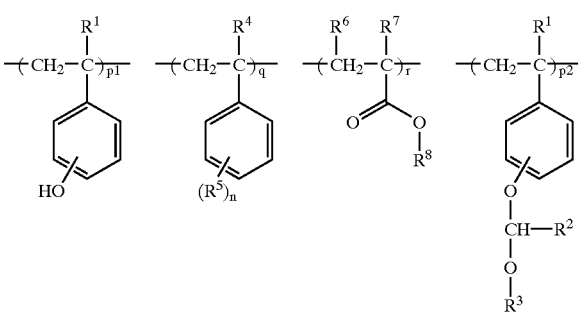

(2)

Herein, $R^1$ and $R^4$ each are hydrogen or methyl; $R^2$ and $R^3$ each are a straight or branched alkyl group of 1 to 10 carbon atoms, or $R^2$ and $R^3$, taken together, may form a ring; $R^5$ is hydrogen, a hydroxyl group, straight or branched alkyl group having 1 to 10 carbon atoms, substitutable alkoxy group having 1 to 10 carbon atoms, halogen atom or acid labile group; $R^6$ and $R^7$ each are hydrogen, a methyl group, alkoxycarbonyl group having 2 to 10 carbon atoms, cyano group or halogen atom; $R^8$ is a tertiary alkyl group of 4 to 20 carbon atoms; n is 0 or a positive integer of 1 to 4, p is a positive number, p1 is a positive number, p2 is 0 or a positive number, and p1+p2=p, q and r each are 0 or a positive number, q and r are not equal to 0 at the same time.

Examples of the straight or branched alkyl group include methyl, ethyl, propyl, isopropyl, n-butyl, iso-butyl and tert-butyl. When $R^2$ and $R^3$ together bond with the carbon and oxygen atoms to form a ring, the ring is preferably a 3- to 7-membered ring, such as 2-furanyloxy or 2-pyranyloxy.

Examples of the substituable alkoxy group include methoxy group, ethoxy group, propoxy group, tert-butoxy group and tert-amyloxy group. Examples of the alkoxycarbonyl group include tert-butoxycarbonyl group and tert-amyloxycarbonyl group.

The acid labile group of $R^5$ and $R^0$ is selected from a variety of such groups, especially groups of the following general formulae (3) and (4), straight, branched or cyclic tertiary alkoxy group of 4 to 20 carbon atoms, trialkylsiloxy groups whose alkyl groups each have 1 to 6 carbon atoms, oxoalkoxy groups of 4 to 20 carbon atoms, tetrahydropyranyloxy, tetrahydrofuranyloxy and trialkylsiloxy groups.

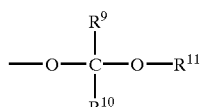

(3)

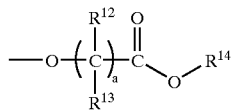

(4)

Herein, $R^9$, $R^{10}$, $R^{12}$ and $R^{13}$ are independently selected from hydrogen and straight or branched alkyl groups of 1 to 8 carbon atoms. $R^{11}$ is a monovalent hydrocarbon group of 1 to 18 carbon atoms, such as alkyl or aryl, which may be separated by an oxygen atom. A pair of $R^9$ and $R^{10}$, a pair of $R^9$ and $R^{11}$, or a pair of $R^{10}$ and $R^{11}$ may form a ring, and each of $R^9$, $R^{10}$ and $R^{11}$ is a straight or branched alkylene group of 1 to 18 carbon atoms when they form a ring. $R^{14}$ is a straight, branched or cyclic alkyl group of 4 to 40 carbon atoms. The subscript "a" is 0 or a positive number.

Illustrative examples of the acid labile group of formula (3) include those having an intervening oxygen atom, such as methoxyethyloxy, ethoxyethyloxy, n-propoxyethyloxy, iso-propoxyethyloxy, n-butoxyethyloxy, iso-butoxyethyloxy, tert-butoxyethyloxy, cyclohexyloxyethyloxy, methoxy-propyloxy, ethoxypropyloxy, 1-methoxy-1-methyl-ethyloxy, and 1-ethoxy-1-methyl-ethyloxy. Illustrative examples of the acid labile group of formula (4) include tert-butoxycarbonyloxy, tert-butoxycarbonylmethyloxy, ethylcyclopentyl-carbonyloxy, ethylcyclohexylcarbonyloxy, and methylcyclopentylcarbonyloxy. Exemplary of the trialkylsiloxy group are those in which alkyl groups each have 1 to 6 carbon atoms, such as trimethylsiloxy.

It is embraced within the scope of the invention that $R^5$ is an acid labile group of formula (3) which is coincident with —$OCHR^2$—$OR^3$. This polymer is arrived at by partially deblocking acid labile groups (—$OCHR^2$—$OR^3$) from the polymer of formula (1) as shown below.

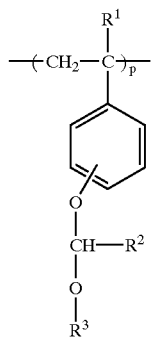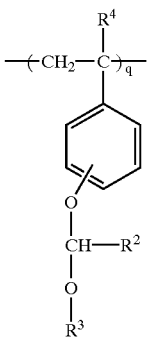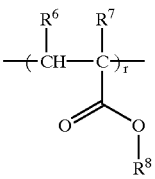

-continued

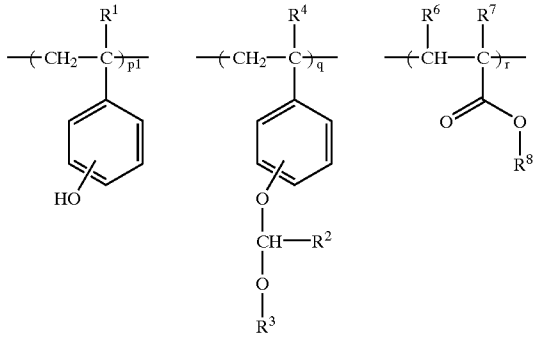

Where $R^6$ and $R^7$ stand for halogen atoms, fluorine, chlorine and bromine are exemplary.

$R^8$ stands for a tertiary alkyl group which is selected from a variety of such groups, and preferably groups of the following general formulae (5) and (6).

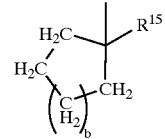

(5)

Herein, $R^{15}$ is a methyl, ethyl, isopropyl, cyclohexyl, cyclopentyl, vinyl, acetyl, phenyl, benzyl or cyano group, and b is an integer of 0 to 3.

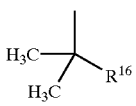

(6)

Herein $R^{16}$ is a methyl, ethyl, isopropyl, cyclohexyl, cyclopentyl, vinyl, phenyl, benzyl or cyano group.

The cyclic alkyl groups of formula (5) are preferably 5- or 6-membered rings. Illustrative examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

Illustrative examples of the alkyl group of formula (6) include tert-butyl, 1-vinyldimethyl, 1-benzyldimethyl, 1-phenyldimethyl and 1-cyanodimethyl.

It is preferred from the characteristics of resist composition standpoint that in formula (2), p, q, and r satisfy the following equations: $0 \leq r/(p+q+r) \leq 0.5$, more preferably $0 \leq r/(p+q+r) \leq 0.40$, $0 < p/(p+q+r) \leq 0.8$, more preferably $0.3 \leq p/(p+q+r) \leq 0.8$, and $0 \leq q/(p+q+r) \leq 0.30$. It is excluded that q and r are equal to 0 at the same time.

If q and r are equal to 0 at the same time, that is, if the polymer of formula (2) does not include those units with subscripts q and r, a contrast of alkali dissolution rate is lost and resolution becomes poor. If the proportion of p is too high, unexposed areas may have too high an alkali dissolution rate. By setting p and r to be positive numbers and properly selecting the value of q and r within the above range, the size and shape of a resist pattern can be controlled as desired.

The polymers (1) and (2) should have a weight average molecular weight (Mw) of about 1,000 to 500,000 and preferably about 2,000 to 30,000, as determined by the procedure to be described later. With too low Mw, polymers become less resistant to heat. Polymers with too high Mw have low alkali solubility and tend to induce a footing phenomenon after pattern formation.

It is recommended that the multi-component copolymers (1) and (2) have a controlled molecular weight dispersity (Mw/Mn). If a copolymer has a wide dispersity, it contains more polymer fractions of low molecular weight and high molecular weight and thus forms a pattern after exposure with foreign matter left thereon or its shape disrupted. The influence of a molecular weight and its dispersity becomes greater as the pattern rule becomes finer. In order that a resist composition be advantageously used in patterning features to a finer size, the multi-component copolymer should preferably be a narrow disperse one having a molecular weight dispersity of 1.0 to 1.8, especially 1.0 to 1.3. In one preferred embodiment, a very narrow disperse polymer (1) having a molecular weight dispersity of 1.0 to 1.2 can be produced by anionic polymerization for synthesis, and a similarly very narrow disperse polymer (2) can be produced therefrom. The inventive method, even when radical polymerization is employed, can produce a narrower disperse polymer (2) than the prior art method of effecting radical polymerization on an acetoxy group-blocked monomer.

In a first approach, the polymer (2) is synthesized by effecting heat polymerization on an alkoxyalkoxystyrene monomer, a (meth)acrylic tertiary ester monomer and optionally, a styrene or styrene derivative monomer in an organic solvent in the presence of a radical initiator, subjecting the resulting polymer (1) to acid hydrolysis in an organic solvent for deblocking the acetal protective groups, thereby producing a polymer (2), i.e., multi-component copolymer comprising hydroxystyrene and (meth)acrylic tertiary ester units with —OCHR²—OR³ being incorporated. The organic solvent used during the polymerization is toluene, benzene, tetrahydrofuran, diethyl ether or dioxane, to name a few. Representative of the polymerization initiator are 2,2'-azobisisobutyronitrile, 2,2'-azobis(2,4-dimethylvaleronitrile), dimethyl-2,2-azobis(2-methylpropionate), benzoyl peroxide and lauroyl peroxide. Polymerization may be effected by heating at about 50° C. to 80° C. The reaction time is usually about 2 to 100 hours, preferably about 5 to 20 hours. For acid hydrolysis, useful catalysts include oxalic acid, acetic acid and pyridinium p-toluenesulfonate; the reaction temperature is about −20° C. to 100° C., preferably about 20° C. to 50° C.; and the reaction time is usually about 0.2 to 100 hours, preferably about 0.5 to 20 hours.

As a second approach, living anion polymerization is possible. Use is made of an alkoxyalkoxystyrene monomer, a (meth)acrylic tertiary ester monomer and optionally, a styrene or styrene derivative monomer, and an organic solvent, which have been dried. Examples of the organic solvent which can be used herein include hexane, cyclohexane, toluene, benzene, diethyl ether and tetrahydrofuran. A necessary amount of anion species is added to the organic solvent, and thereafter, the monomers are added thereto whereupon polymerization is carried out. The anion species which can be used herein is selected from organometallic compounds such as alkyllithium, alkylmagnesium halides, naphthalene sodium and alkylated lanthanoid compounds, with butyllithium and butylmagnesium chloride being especially preferred. The polymerization temperature is preferably in the range of −100° C. to 30° C. and more preferably in the range of −80° C. to 10° C. for better control of polymerization. For deblocking reaction, the same technique as used in radical polymerization may be used.

In a further preferred embodiment, by introducing acid labile groups into some or all of phenolic hydroxyl groups on the polymer of formula (2) thus obtained, a polymer comprising recurring units of the following general formula (2') can be produced.

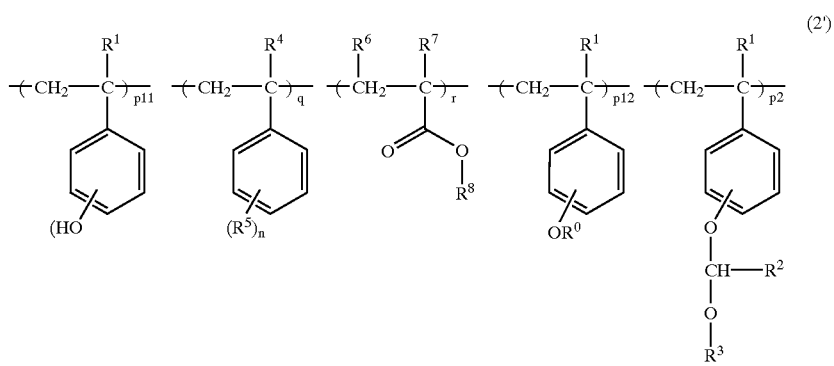

Herein $R^0$ is an acid labile group, p11 is 0 or a positive number, p12 is a positive number, p11+p12=p1, $R^1$ to $R^8$, n, p1, p2, q and r are as defined above.

The acid labile group is preferably of the formula (3) or (4) defined above. It is possible that after the polymer prepared as above is isolated, acid labile groups of formula (3) or (4) be introduced into phenolic hydroxyl groups thereon. For example, phenolic hydroxyl groups on the polymer can be reacted with an alkenyl ether compound in the presence of an acid catalyst to produce a polymer in which the phenolic hydroxyl groups are partially blocked or protected with alkoxyalkyl groups.

The reaction solvent used herein is preferably an aprotic polar solvent such as dimethylformamide, dimethylacetamide, tetrahydrofuran or ethyl acetate, which may be used alone or in admixture of any. The acid catalyst is preferably selected from among hydrochloric acid, sulfuric acid, trifluoromethanesulfonic acid, p-toluene-sulfonic acid, methanesulfonic acid, and pyridinium p-toluenesulfonate. The amount thereof used is 0.1 to 10 mol % per mol of the entire hydrogen atoms of phenolic hydroxyl groups on the polymer. The reaction temperature is about −20° C. to 100° C., preferably about 0° C. to 60° C.; and the reaction time is usually about 0.2 to 100 hours, preferably about 0.5 to 20 hours.

In another embodiment, a halogenated alkyl ether compound can be used. It is reacted with the polymer in the presence of a base to produce a polymer in which phenolic hydroxyl groups are partially protected with alkoxyalkyl groups.

In this embodiment, the reaction solvent used is preferably selected from aprotic polar solvents such as acetonitrile, acetone, dimethylformamide, dimethylacetamide, tetrahydrofuran, and dimethylsulfoxide. Such solvents may be used alone or in admixture of any. Preferred bases include triethylamine, pyridine, diisopropylamine and potassium carbonate. The amount thereof used is preferably at least 10 mol % per mol of the entire hydrogen atoms of phenolic hydroxyl groups on the polymer. The reaction temperature is often in the range of about −50° C. to 100° C., and preferably about 0° C. to 60° C. The reaction time is from about 0.5 to 100 hours, and preferably about 1 to 20 hours.

In a further embodiment, the acid labile group of formula (4) can be introduced by reacting a dialkyl dicarbonate compound or alkoxycarbonylalkyl halide with the polymer in a solvent in the presence of a base. The reaction solvent used is preferably selected from aprotic polar solvents such as acetonitrile, acetone, dimethylformamide, dimethylacetamide, tetrahydrofuran, and dimethyl sulfoxide. Such solvents may be used alone or in admixture of any. Preferred bases include triethylamine, pyridine, imidazole, diisopropylamine and potassium carbonate. The amount thereof used is preferably at least 10 mol % per mol of the entire hydrogen atoms of phenolic hydroxyl groups on the starting polymer. The reaction temperature is often in the range of about 0° C. to 100° C., and preferably about 0° C. to 60° C. The reaction time is from about 0.2 to 100 hours, and preferably about 1 to 10 hours.

Exemplary of the dialkyl dicarbonate compound are di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide and tert-butoxycarbonylethyl chloride.

Resist Composition

The resist composition of the invention uses the polymer (2) or (2') prepared by the inventive method as a base resin. The resist composition may be either positive or negative working. A chemically amplified resist composition, and especially a chemically amplified positive resist composition is advantageous.

Specifically the resist composition comprises (A) an organic solvent, (B) the polymer (2) or (2') prepared by the inventive method as a base resin, and (C) a photoacid generator. If desired, the resist composition further includes (D) a dissolution inhibitor and/or (E) a basic compound.

In the chemically amplified, positive working resist composition of the invention, component (A) is an organic solvent. Illustrative, non-limiting, examples of the solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methyl-pyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the base resin in the chemically amplified positive resist composition. The concentration is not limited to this range as long as film formation by existing methods is possible.

The photoacid generator (C) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl) diphenylsulfonium, bis(4-tert-butoxyphenyl) phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris (4-tert-butoxycarbonyl-methyloxyphenyl)sulfonium, (4-tert-butoxyphenyl)bis(4-dimethylaminophenyl) sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodinium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethyl-glyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluene-sulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethyl-glyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Of these photoacid generators, the sulfonium salts, bissulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (C) is 0 to about 20 parts, more preferably about 1 to 10 parts by weight per 100 parts by weight of the base resin in the composition. The photoacid generators may be used alone or in admixture of two or more. The transmittance of the resist film can be controlled by using a photoacid generator having a low transmittance at the exposure wavelength and adjusting the amount of the photoacid generator added.

The dissolution inhibitor (D) is a compound having on the molecule at least two phenolic hydroxyl groups, in which an average of from 10 to 100 mol % of all the hydrogen atoms on the phenolic hydroxyl groups are replaced with acid labile groups. The compound has a weight average molecular weight within the range of 100 to 1,000, and preferably 150 to 800. The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. Less amounts of the dissolution inhibitor may fail to yield an improved resolution, whereas too much amounts would lead to slimming of the patterned film, and thus a decline in resolution.

Illustrative, non-limiting, examples of the dissolution inhibitor (D) which are useful herein include
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl)-valerate,
tert-butyl 4,4-bis(4'-(2"-tetrahydrofuranyloxy)phenyl)-valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl)-valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B1) may also be included alone or in admixture.

$$N(X)_n(Y)_{3-n} \qquad \qquad B1$$

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

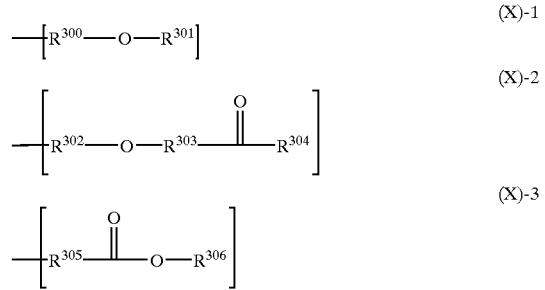

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B1) include tris(2-methoxymethoxyethyl)amine, tris{2-(2-methoxyethoxy)ethyl}amine, tris{2-(2-methoxyethoxymethoxy)ethyl}-amine, tris{2-(1-methoxyethoxy)ethyl}amine, tris{2-(1-ethoxyethoxy) ethyl}amine, tris{2-(1-ethoxypropoxy)ethyl}-amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy) ethyl]amine, tris[2-(methoxycarbonylmethyl)oxyethyl] amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl] ethylamine, N,N-bis(2-acetoxyethyl)-2-[(methoxycarbonyl) methoxycarbonyl]ethylamine, N,N-bis(2-hydroxyethyl)-2-(2-oxopropoxycarbonyl)ethylamine, N,N-bis (2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl) ethylamine, N,N-bis(2-hydroxyethyl)-2-[(2-oxotetrahydrofuran-3-yl)oxycarbonyl]ethylamine, N,N-bis (2-acetoxyethyl)-2-[(2-oxotetrahydrofuran-3-yl) oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl) ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl] amine, N-(2-methoxyethyl)-bis[2-(methoxycarbonyl)ethyl] amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl) amine, N-ethyl-bis[2-(methoxycarbonyloxy)ethyl]amine, N-ethyl-bis[2-(tert-butoxycarbonyloxy)ethyl]amine, tris (methoxycarbonylmethyl)amine, tris (ethoxycarbonylmethyl)amine, N-butyl-bis (methoxycarbonylmethyl)amine, N-hexyl-bis (methoxycarbonylmethyl)-amine, and β-(diethylamino)-δ-valerolactone.

The basic compounds may be used alone or in admixture of two or more. The basic compound is preferably formulated in an amount of 0 to 2 parts, and especially 0.01 to 1 part by weight, per 100 parts by weight of the base resin in the resist composition. The use of more than 2 parts of the basis compound would result in too low a sensitivity.

In the resist composition, a surfactant may be added for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Florade FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), and acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the base resin in the resist composition.

For the microfabrication of integrated circuits, any well-known lithography may be used to form a resist pattern from the chemical amplification, positive working, resist composition comprising (A) an organic solvent, (B) the polymer of formula (2), and (C) a photoacid generator, as illustrated above, according to the invention.

The composition is applied onto a substrate (on which an integrated circuit is to be formed, e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 µm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, soft x-rays, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation. The abbreviation AIBN is azobisisobutyronitrile, Mw is a weight average molecular weight, Mn is a number average molecular weight, Mw/Mn is a molecular weight dispersity, NMR is nuclear magnetic resonance, GPC is gel permeation chromatography.

Synthesis Example 1

To a 2-liter flask were added 65.1 g of p-ethoxyethoxystyrene, 23.1 g of t-butyl methacrylate, and 140 g of toluene as a solvent. The reactor was cooled to −70° C. in a nitrogen atmosphere, whereupon vacuum deaeration and nitrogen flow were repeated three times. The reactor was warmed up to room temperature, 3.4 g of AIBN was added as a polymerization initiator, and the reactor was further heated to 60° C., at which reaction was effected for 20 hours. A mixture of 240 ml of methanol and 30 ml of water was added dropwise to the reaction solution, which was stirred for 15 minutes and allowed to stand for 2 hours. The lower layer or polymer layer was separated. The polymer layer was concentrated, to which were added 480 ml of tetrahydrofuran, 360 ml of methanol and 1.8 g of oxalic acid. The mixture was heated at 40° C. and maintained at the temperature for 20 hours for deblocking reaction. The reaction solution was neutralized with 20 g of pyridine, concentrated, and dissolved in 0.3 liter of acetone. This was poured into 5.0 liters of water for precipitation, followed by washing. The resulting white solids were filtered and vacuum dried at 40° C., obtaining 57 g of a white polymer.

The polymer was analyzed by $^{13}$C-NMR, $^{1}$H-NMR and GPC, with the analytical results shown below. Copolymer compositional ratio=hydroxystyrene:t-butyl methacrylate= 66.0:34.0

Mw=16,900

Mw/Mn=1.07

This polymer is designated Poly-A.

Synthesis Example 2

To a 2-liter flask were added 59.1 g of p-ethoxyethoxystyrene, 20.9 g of 1-ethylcyclopentyl methacrylate, and 140 g of toluene as a solvent. The reactor was cooled to −70° C. in a nitrogen atmosphere, whereupon vacuum deaeration and nitrogen flow were repeated three times. The reactor was warmed up to room temperature, 3.4 g of AIBN was added as a polymerization initiator, and the reactor was further heated to 60° C., at which reaction was effected for 20 hours. A mixture of 240 ml of methanol and 30 ml of water was added dropwise to the reaction solution, which was stirred for 15 minutes and allowed to stand for 2 hours. The lower layer or polymer layer was separated. The polymer layer was concentrated, to which were added 480 ml of tetrahydrofuran, 360 ml of methanol and 1.8 g of oxalic acid. The mixture was heated at 40° C. and maintained at the temperature for 20 hours for deblocking reaction. The reaction solution was neutralized with 20 g of pyridine, concentrated, and dissolved in 0.3 liter of acetone. This was poured into 5.0 liters of water for precipitation, followed by washing. The resulting white solids were filtered and vacuum dried at 40° C., obtaining 53 g of a white polymer.

The polymer was analyzed by $^{13}$C-NMR, $^{1}$H-NMR and GPC, with the analytical results shown below. Copolymer compositional ratio=hydroxystyrene:1-ethylcyclopentyl methacrylate=72.5:27.5

Mw=17,100

Mw/Mn=1.06

This polymer is designated Poly-B.

Synthesis Example 3

To a 2-liter flask were added 58.7 g of p-ethoxyethoxystyrene, 3.8 g of styrene, 17.5 g of 1-ethylcyclopentyl methacrylate, and 140 g of toluene as a solvent. The reactor was cooled to −70° C. in a nitrogen atmosphere, whereupon vacuum deaeration and nitrogen flow were repeated three times. The reactor was warmed up to room temperature, 3.4 g of AIBN was added as a polymerization initiator, and the reactor was further heated to 60° C., at which reaction was effected for 20 hours. A mixture of 240 ml of methanol and 30 ml of water was added dropwise to the reaction solution, which was stirred for 15 minutes and allowed to stand for 2 hours. The lower layer or polymer layer was separated. The polymer layer was concentrated, to which were added 480 ml of tetrahydrofuran, 360 ml of methanol and 1.8 g of oxalic acid. The mixture was heated at 40° C. and maintained at the temperature for 20 hours for deblocking reaction. The reaction solution was neutralized with 20 g of pyridine, concentrated, and dissolved in 0.3 liter of acetone. This was poured into 5.0 liters of water for precipitation, followed by washing. The resulting white solids were filtered and vacuum dried at 40° C., obtaining 59 g of a white polymer.

The polymer was analyzed by $^{13}$C-NMR, $^1$H-NMR and GPC, with the analytical results shown below. Copolymer compositional ratio=hydroxystyrene:styrene:1-ethylcyclopentyl methacrylate=73.5:5.5:21.0

Mw=15,900

Mw/Mn=1.03

This polymer is designated Poly-C.

Synthesis Example 4

To a 2-liter flask were added 65.6 g of p-ethoxyethoxystyrene, 14.4 g of 1-ethylcyclopentyl methacrylate, and 140 g of toluene as a solvent. The reactor was cooled to −70° C. in a nitrogen atmosphere, whereupon vacuum deaeration and nitrogen flow were repeated three times. The reactor was warmed up to room temperature, 3.4 g of AIBN was added as a polymerization initiator, and the reactor was further heated to 60° C., at which reaction was effected for 20 hours. A mixture of 240 ml of methanol and 30 ml of water was added dropwise to the reaction solution, which was stirred for 15 minutes and allowed to stand for 2 hours. The lower layer or polymer layer was separated. The polymer layer was concentrated, to which were added 480 ml of tetrahydrofuran, 360 ml of methanol and 2.0 g of acetic acid. The mixture was heated at 20° C. and maintained at the temperature for 38 hours for partial deblocking reaction. The reaction solution was neutralized with 20 g of pyridine, concentrated, and dissolved in 0.3 liter of acetone. This was poured into 5.0 liters of water for precipitation, followed by washing. The resulting white solids were filtered and vacuum dried at 40° C., obtaining 62 g of a white polymer.

The polymer was analyzed by $^{13}$C-NMR, $^1$H-NMR and GPC, with the analytical results shown below. Copolymer compositional ratio=hydroxystyrene:ethoxyethoxystyrene:1-ethylcyclopentyl methacrylate=71.8:9.9:18.3

Mw=16,800

Mw/Mn=1.02

This polymer is designated Poly-D.

Synthesis Example 5

After a 2-liter flask was dried in vacuum, 1,500 g of tetrahydrofuran which had been dewatered by distillation in a nitrogen atmosphere was admitted to the flask, which was cooled to −75° C. Thereafter, 14.5 g of s-butyllithium (in 1N cyclohexane solution) was admitted, and 96.4 g of p-ethoxyethoxystyrene which had been dewatered by distillation with the aid of metallic sodium was added dropwise. The rate of addition was carefully controlled so that the internal temperature of the reaction solution might not exceed −65° C. After 30 minutes of reaction, 43.6 g of t-butyl methacrylate which had been dewatered by distillation with the aid of calcium hydride was added dropwise to the reaction solution. At the end of dropwise addition, the temperature was slowly raised to 0° C. over 2 hours for reaction. Thereafter, 10 g of methanol was admitted to stop the reaction. The reaction solution was heated to room temperature and concentrated in vacuum. Methanol, 800 g, was admitted to the concentrate, which was stirred and then allowed to stand, and the upper or methanol layer was separated off. This operation was repeated three times, removing the metallic lithium. The lower layer or polymer solution was concentrated, combined with 840 ml of tetrahydrofuran, 630 ml of methanol and 3.2 g of oxalic acid, heated at 40° C. and maintained at the temperature for 20 hours for deblocking reaction. The reaction solution was neutralized with 35 g of pyridine, concentrated, and dissolved in 0.6 liter of acetone. This was poured into 7.0 liters of water for precipitation, followed by washing. The resulting white solids were filtered and vacuum dried at 40° C., obtaining 111 g of a white polymer.

The polymer was analyzed by $^{13}$C-NMR, $^1$H-NMR and GPC, with the analytical results shown below. Copolymer compositional ratio=hydroxystyrene:t-butyl methacrylate=62.6:37.4

Mw=15,800

Mw/Mn=1.08

This polymer is designated Poly-E.

Synthesis Example 6

After a 2-liter flask was dried in vacuum, 1,500 g of tetrahydrofuran which had been dewatered by distillation in a nitrogen atmosphere was admitted to the flask, which was cooled to −75° C. Thereafter, 14.5 g of s-butyllithium (in 1N cyclohexane solution) was admitted, and 99.5 g of p-ethoxyethoxystyrene which had been dewatered by distillation with the aid of metallic sodium was added dropwise. The rate of addition was carefully controlled so that the internal temperature of the reaction solution might not exceed −65° C. After 30 minutes of reaction, 40.4 g of 1-ethylcyclopentyl methacrylate which had been dewatered by distillation with the aid of metallic sodium was added dropwise to the reaction solution. At the end of dropwise addition, the temperature was slowly raised to 0° C. over 2 hours for reaction. Thereafter, 10 g of methanol was admitted to stop the reaction. The reaction solution was heated to room temperature and concentrated in vacuum. Methanol, 800 g, was admitted to the concentrate, which was stirred and then allowed to stand, and the upper or methanol layer was separated off. This operation was repeated three times, removing the metallic lithium. The lower layer or polymer solution was concentrated, combined with 840 ml of tetrahydrofuran, 630 ml of methanol and 3.2 g of oxalic acid, heated at 40° C. and maintained at the temperature for 20 hours for deblocking reaction. The reaction solution was neutralized with 35 g of pyridine, concentrated, and dissolved in 0.6 liter of acetone. This was poured into 7.0 liters of water for precipitation, followed by washing. The resulting white solids were filtered and vacuum dried at 40° C., obtaining 101 g of a white polymer.

The polymer was analyzed by $^{13}$C-NMR, $^1$H-NMR and GPC, with the analytical results shown below. Copolymer compositional ratio=hydroxystyrene:1-ethylcyclopentyl methacrylate=70.8:29.2

Mw=16,700

Mw/Mn=1.09

This polymer is designated Poly-F.

Synthesis Example 7

After a 2-liter flask was dried in vacuum, 1,500 g of tetrahydrofuran which had been dewatered by distillation in a nitrogen atmosphere was admitted to the flask, which was cooled to −75° C. Thereafter, 14.5 g of s-butyllithium (in 1N cyclohexane solution) was admitted, and a mixture of 99.5 g of p-ethoxyethoxystyrene which had been dewatered by distillation with the aid of metallic sodium and 35.0 g of p-t-butoxystyrene which had been similarly dewatered was added dropwise. The rate of addition was carefully controlled so that the internal temperature of the reaction solution might not exceed −65° C. After 30 minutes of reaction, 10 g of methanol was admitted to stop the reaction. The reaction solution was heated to room temperature and concentrated in vacuum. Methanol, 800 g, was admitted to the concentrate, which was stirred and then allowed to stand, and the upper or methanol layer was separated off. This operation was repeated three times, removing metallic lithium. The lower layer or polymer solution was concentrated, combined with 840 ml of tetrahydrofuran, 630 ml of methanol and 3.2 g of oxalic acid, heated at 40° C. and maintained at the temperature for 20 hours for deblocking reaction. The reaction solution was neutralized with 35 g of pyridine, concentrated, and dissolved in 0.6 liter of acetone. This was poured into 7.0 liters of water for precipitation, followed by washing. The resulting white solids were filtered and vacuum dried at 40° C., obtaining 84.7 g of a white polymer.

The polymer was analyzed by $^{13}$C-NMR, $^1$H-NMR and GPC, with the analytical results shown below. Copolymer compositional ratio=hydroxystyrene:t-butoxystyrene=73.8:26.2

Mw=13,500

Mw/Mn=1.07

This polymer is designated Poly-G.

Synthesis Example 8

After a 2-liter flask was dried in vacuum, 1,500 g of tetrahydrofuran which had been dewatered by distillation in a nitrogen atmosphere was admitted to the flask, which was cooled to −75° C. Thereafter, 14.5 g of s-butyllithium (in 1N cyclohexane solution) was admitted, and a mixture of 99.5 g of p-ethoxyethoxystyrene which had been dewatered by distillation with the aid of metallic sodium and 26.9 g of p-t-butoxystyrene which had been similarly dewatered was added dropwise. The rate of addition was carefully controlled so that the internal temperature of the reaction solution might not exceed −65° C. After 30 minutes of reaction, 7.8 g of 1-ethylcyclopentyl methacrylate which had been dewatered by distillation with the aid of metallic sodium was added dropwise to the reaction solution. At the end of dropwise addition, the temperature was slowly raised to 0° C. over 2 hours for reaction. Thereafter, 10 g of methanol was admitted to stop the reaction. The reaction solution was heated to room temperature and concentrated in vacuum. Methanol, 800 g, was admitted to the concentrate, which was stirred and then allowed to stand, and the upper or methanol layer was separated off. This operation was repeated three times, removing metallic lithium. The lower layer or polymer solution was concentrated, combined with 840 ml of tetrahydrofuran, 630 ml of methanol and 3.2 g of oxalic acid, heated at 40° C. and maintained at the temperature for 20 hours for deblocking reaction. The reaction solution was neutralized with 35 g of pyridine, concentrated, and dissolved in 0.6 liter of acetone. This was poured into 7.0 liters of water for precipitation, followed by washing. The resulting white solids were filtered and vacuum dried at 40° C., obtaining 101 g of a white polymer.

The polymer was analyzed by $^{13}$C-NMR, $^1$H-NMR and GPC, with the analytical results shown below. Copolymer compositional ratio=hydroxystyrene:t-butoxystyrene:1-ethylcyclopentyl methacrylate=70.8:24.0:5.2

Mw=14,500

Mw/Mn=1.10

This polymer is designated Poly-H.

Comparative Synthesis Example 1

To a 2-liter flask were added 53.9 g of acetoxystyrene, 26.1 g of t-butyl methacrylate, and 140 g of toluene as a solvent. The reactor was cooled to −70° C. in a nitrogen atmosphere, whereupon vacuum deaeration and nitrogen flow were repeated three times. The reactor was warmed up to room temperature, 3.4 g of AIBN was added as a polymerization initiator, and the reactor was further heated to 60° C., at which reaction was effected for 20 hours. The reaction solution was concentrated to one half and poured into a mixture of 4.5 liters of methanol and 0.5 liter of water for precipitation. The resulting white solids were filtered and vacuum dried at 60° C., obtaining 76.3 g of a white polymer. The polymer was dissolved again in 0.5 liter of methanol and 1.0 liter of tetrahydrofuran, to which 70 g of triethylamine and 15 g of water were added, and deblocking reaction was effected. The reaction solution was neutralized with acetic acid, concentrated, and dissolved in 0.5 liter of acetone. Similar steps of precipitation, filtration and drying were repeated, obtaining 58.0 g of a white polymer.

The polymer was analyzed by $^{13}$C-NMR, $^1$H-NMR and GPC, with the analytical results shown below. Copolymer compositional ratio=hydroxystyrene:t-butyl methacrylate=65.2:34.8

Mw=15,600

Mw/Mn=1.87

This polymer is designated Poly-I.

Comparative Synthesis Example 2

To a 2-liter flask were added 54.9 g of acetoxystyrene, 25.1 g of 1-ethylcyclopentyl methacrylate, and 140 g of toluene as a solvent. The reactor was cooled to −70° C. in a nitrogen atmosphere, whereupon vacuum deaeration and nitrogen flow were repeated three times. The reactor was warmed up to room temperature, 3.1 g of AIBN was added as a polymerization initiator, and the reactor was further heated to 60° C., at which reaction was effected for 20 hours. The reaction solution was concentrated to one half and poured into a mixture of 4.5 liters of methanol and 0.5 liter of water for precipitation. The resulting white solids were filtered and vacuum dried at 60° C., obtaining 77.1 g of a white polymer. The polymer was dissolved again in 0.5 liter of methanol and 1.0 liter of tetrahydrofuran, to which 70 g of triethylamine and 15 g of water were added, and deblocking reaction was effected. The reaction solution was neutralized with acetic acid, concentrated, and dissolved in 0.5 liter of acetone. Similar steps of precipitation, filtration and drying were repeated, obtaining 58.6 g of a white polymer.

The polymer was analyzed by $^{13}$C-NMR, $^{1}$H-NMR and GPC, with the analytical results shown below. Copolymer compositional ratio=hydroxystyrene:1-ethylcyclopentyl methacrylate=71.5:28.5

Mw=16,300

Mw/Mn=1.89

This polymer is designated Poly-J.

Examples 1–8 & Comparative Examples 1–2

Resist compositions were prepared according to the formulation shown in Tables 1 and 2. The polymers are Poly-A to J obtained in the above Synthesis Examples and Comparative Synthesis Examples, and the remaining components listed in Tables 1 and 2 have the following meaning.

PAG1: triphenylsulfonium 4-(4'-methylphenylsulfonyloxy)-benzenesulfonate
PAG2: (4-tert-butoxyphenyl)diphenylsulfonium 10-camphorsulfonate
PAG3: bis(cyclohexylsulfonyl)diazomethane
PAG4: bis(2,4-dimethylphenylsulfonyl)diazomethane
Dissolution inhibitor A: bis(4-(2'-tetrahydropyranyloxy)phenyl)methane
Basic compound A: tris(2-methoxyethyl)amine
Surfactant A: FC-430 (Sumitomo 3M Co., Ltd.)
Surfactant B: Surflon S-381 (Asahi Glass Co., Ltd.)
Solvent A: propylene glycol methyl ether acetate
Solvent B: ethyl lactate

TABLE 1

| Component | Example | | | |
|---|---|---|---|---|
| (pbw) | 1 | 2 | 3 | 4 |
| Poly-A | 80 | — | — | — |
| Poly-B | — | 80 | — | — |
| Poly-C | — | — | 80 | — |
| Poly-D | — | — | — | 80 |
| PAG1 | 2 | 2 | 2 | 1 |
| PAG2 | 1 | 1 | 1 | 1 |
| PAG3 | — | — | — | 0.5 |
| PAG4 | — | — | — | 0.5 |
| Dissolution inhibitor A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

TABLE 2

| Component | Example | | | | Comparative Example | |
|---|---|---|---|---|---|---|
| (pbw) | 5 | 6 | 7 | 8 | 1 | 2 |
| poly-E | 80 | — | — | — | — | — |
| poly-F | — | 80 | — | — | — | — |
| poly-G | — | — | 80 | — | — | — |
| poly-H | — | — | — | 80 | — | — |
| poly-I | — | — | — | — | 80 | — |
| poly-J | — | — | — | — | — | 80 |
| PAG1 | 2 | 2 | 2 | 2 | 2 | 2 |
| PAG2 | 1 | 1 | 1 | 1 | 1 | 1 |
| PAG3 | — | — | — | — | — | — |
| PAG4 | — | — | — | — | — | — |
| Dissolution inhibitor A | — | — | — | — | — | — |
| Basic compound A | 0.2 | 0.2 | 0.2 | 0.2 | 0.2 | 0.2 |
| Surfactant A | 0.07 | 0.07 | 0.07 | 0.07 | 0.07 | 0.07 |
| Surfactant B | 0.07 | 0.07 | 0.07 | 0.07 | 0.07 | 0.07 |
| Solvent A | 300 | 300 | 300 | 300 | 300 | 300 |
| Solvent B | 130 | 130 | 130 | 130 | 130 | 130 |

The resist materials thus obtained were each filtered through a 0.2-μm Teflon filter, thereby giving resist solutions. These resist solutions were spin-coated onto silicon wafers, then baked on a hot plate at 100° C. for 90 seconds to give resist films having a thickness of 0.6 μm.

The resist films were exposed using an excimer laser stepper NSR2005EX (Nikon Corp., NA 0.5), then baked at 110° C. for 90 seconds (post-exposure baking: PEB), and developed with a solution of 2.38% tetramethylammonium hydroxide in water, thereby giving positive patterns (Examples 1–8 and Comparative Examples 1–2).

The resulting resist patterns were evaluated as described below.

Resist Pattern Evaluation

The exposure dose which provided a 1:1 resolution at the top and bottom of a 0.18-μm line-and-space pattern was the optimum exposure dose (sensitivity Eop). The minimum line width of a line-and-space pattern which was ascertained separate at this dose was the resolution of a test resist. The shape in cross section of the resolved resist pattern was examined under a scanning electron microscope. Line edge roughness on the pattern was observed at the same time. A pattern with less roughness (surface roughness) was rated "good," a pattern with moderate roughness rated "fair," and a pattern with much roughness rated "poor."

The PED stability of a resist was evaluated by effecting post-exposure bake (PEB) after 24 hours of holding from exposure at the optimum dose and determining a variation in line width. The less the variation, the greater is the PED dimensional stability.

The results are shown in Table 3.

TABLE 3

| | Sensitivity (mJ/cm$^2$) | Resolution ($\mu$n) | Profile | Dimensional stability on PED after 24 hours (nm) | Line edge roughness | Dispersity of polymer used |
|---|---|---|---|---|---|---|
| E1 | 33 | 0.17 | somewhat tapered | −7 | fair | 1.07 |
| E2 | 27 | 0.15 | rectangular | −8 | fair | 1.06 |
| E3 | 29 | 0.15 | rectangular | −8 | fair | 1.03 |
| E4 | 26 | 0.15 | rectangular | −10 | poor | 1.02 |
| E5 | 34 | 0.14 | rectangular | −7 | good | 1.08 |
| E6 | 28 | 0.13 | rectangular | −8 | good | 1.09 |
| E7 | 35 | 0.16 | somewhat tapered | −4 | good | 1.07 |
| E8 | 28 | 0.14 | rectangular | −6 | good | 1.10 |
| CE1 | 33 | 0.18 | somewhat tapered | −9 | poor | 1.87 |
| CE2 | 26 | 0.17 | rectangular | −11 | poor | 1.89 |

The polymers produced by the inventive method have a narrower molecular weight dispersity than polymers produced by the prior art methods. The resist compositions in which such polymers are blended as the base resin have advantages including an enhanced dissolution contrast of resist film, high resolution, exposure latitude, process flexibility, good pattern profile after exposure, and minimized line edge roughness. The resist compositions are thus best suited as micropatterning materials and typically as chemically amplified, positive resist compositions for use in VLSI manufacture.

Japanese Patent Application No. 2000-372408 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A method for preparing a polymer comprising recurring units of the following general formula (2) and having a weight average molecular weight (Mw) of about 1,000 to 500,000 and a molecular weight dispersity (Mw/Mn) of 1.0 to 1.3, said method comprising the step of effecting deblocking reaction on a polymer comprising recurring units of the following general formula (1) and having a weight average molecular weight (Mw) of about 1,000 to 500,000 and a molecular weight dispersity (Mw/Mn) of 1.0 to 1.3 in the presence of an acid catalyst,

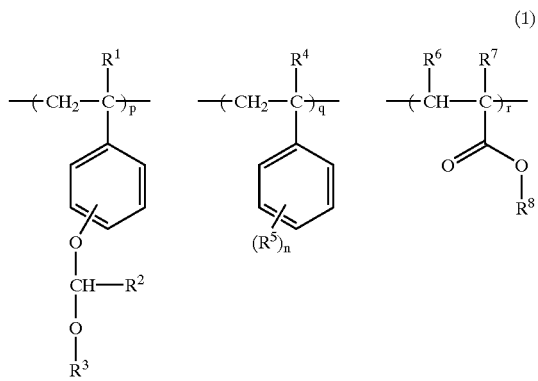

(1)

-continued

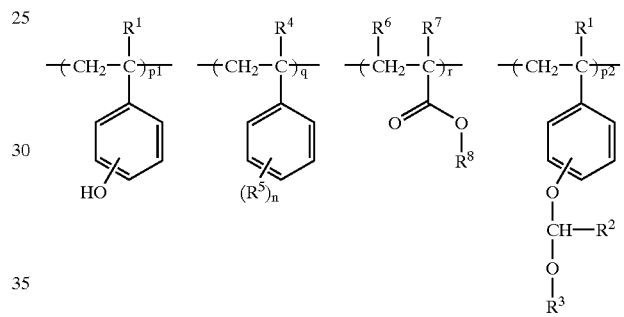

(2)

wherein $R^1$ and $R^4$ each are hydrogen or methyl,
$R^2$ and $R^3$ each are a straight or branched alkyl group of 1 to 10 carbon toms, or $R^2$ and $R^3$, taken together, may form a ring,
$R^5$ is hydrogen, a hydroxyl group, straight or branched alkyl group having 1 to 10 carbon atoms, substitutable alkoxy group having 1 to 10 carbon atoms, halogen atom or acid labile group,
$R^6$ and $R^7$ each are hydrogen, a methyl group, alkoxycarbonyl group having 2 to 10 carbon atoms, cyano group or halogen atom,
$R^8$ is a tertiary alkyl group of 4 to 20 carbon atoms,
n is 0 or a positive integer of 1 to 4,
p is a positive number, q and r each are 0 or a positive number, q and r are not equal to 0 at the same time,
p1 is a positive number, p2 is 0 or a positive number, and p1+p2=p.

2. The method of claim 1 wherein the polymer comprising recurring units of formula (1) has been produced by an anionic polymerization process.

3. The method of claim 1, wherein the polymer (2) is synthesized by heat polymerizing an alkoxyalkoxystyrene monomer, a (meth)acrylic tertiary ester monomer and optionally, a styrene or styrene derivative monomer in an organic solvent in the presence of a radical initiator, and subjecting the resulting polymer (1) to acid hydrolysis in an organic solvent for deblocking the acetal protective groups, thereby producing a polymer (2).

4. The method of claim 3, wherein the organic solvent used during polymerization is toluene, benzene, tetrahydrofuran, diethyl ether or dioxane.

5. The method of claim 3, wherein the radical initiator is 2,2'-azobisisobutyronitrile, 2,2'-azobis(2,4-dimethylvaleronitrile), dimethyl-2,2-azobis(2-methylpropionate), benzoyl peroxide or lauroyl peroxide.

6. The method of claim 3, wherein the polymerization temperature is about 50° C.–80° C. and the reaction time is about 2–100 hours.

7. The method of claim 3, wherein the acid hydrolysis is conducted with a catalyst comprising an oxalic acid, an acetic acid, or a pyridinium p-toluenesulfonate.

8. The method of claim 3, wherein the acid hydrolysis reaction temperature is about −20° C.–100° C. and the reaction time is about 0.2–100 hours.

9. The method of claim 1, wherein the polymer (2) is synthesized by polymerizing an alkoxyalkoxystyrene monomer, a (meth)acrylic tertiary ester monomer and optionally, a styrene or styrene derivative monomer by living anion polymerization in an organic solvent, and subjecting the resulting polymer (1) to acid hydrolysis in an organic solvent for deblocking the acetal protective groups, thereby producing a polymer (2).

10. The method of claim 9, wherein the organic solvent is hexane, cyclohexane, toluene, benzene, diethyl ether or tetrahydrofuran.

11. The method of claim 9, further comprising adding an anionic species to the solvent, which is an organometallic compound or an alkylated lanthanoid compound.

12. The method of claim 9, wherein the polymerization temperature is −100° C.–30° C.

13. A method according to claim 1, wherein polymer (1) has a weight average molecular weight of 2,000–30,000.

14. A method according to claim 1, wherein r is a positive number.

* * * * *